United States Patent
Koyama

(10) Patent No.: US 9,840,645 B2
(45) Date of Patent: Dec. 12, 2017

(54) UNDERFILL MATERIAL AND METHOD FOR MANUFACTURING SEMICONDUCTOR DEVICE USING THE SAME

(71) Applicant: DEXERIALS CORPORATION, Tokyo (JP)

(72) Inventor: Taichi Koyama, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 185 days.

(21) Appl. No.: 14/423,966

(22) PCT Filed: Sep. 10, 2014

(86) PCT No.: PCT/JP2014/073967
§ 371 (c)(1),
(2) Date: Feb. 25, 2015

(87) PCT Pub. No.: WO2015/037634
PCT Pub. Date: Mar. 19, 2015

(65) Prior Publication Data
US 2016/0017191 A1    Jan. 21, 2016

(30) Foreign Application Priority Data
Sep. 11, 2013 (JP) ................. 2013-187980

(51) Int. Cl.
*C08L 53/00* (2006.01)
*C08L 63/00* (2006.01)
(Continued)

(52) U.S. Cl.
CPC ........ *C09J 163/00* (2013.01); *C08G 59/4215* (2013.01); *C08L 63/00* (2013.01);
(Continued)

(58) Field of Classification Search
USPC .......................................... 438/124; 525/118
See application file for complete search history.

(56) References Cited

U.S. PATENT DOCUMENTS

2011/0291300 A1* 12/2011 Hirano ................ C08F 290/064
257/782
2012/0094134 A1* 4/2012 Enna ...................... B32B 27/08
428/474.7
(Continued)

FOREIGN PATENT DOCUMENTS

JP   2005028734 A   2/2005
JP   2013120804 A   6/2013
(Continued)

OTHER PUBLICATIONS

Nov. 11, 2014 International Search Report issued in Application No. PCT/JP2014/073967.

*Primary Examiner* — Mark Kaucher
*Assistant Examiner* — Henry Hu
(74) *Attorney, Agent, or Firm* — Oliff PLC

(57) ABSTRACT

An underfill film material and a method for manufacturing a semiconductor device using the same which enables voidless mounting and favorable solder bonding properties are provided. An underfill material is used which contains an epoxy resin, an acid anhydride, an acrylic resin and an organic peroxide, the underfill material exhibits non-Bingham fluidity at a temperature ranging from 60° C. to 100° C., a storage modulus G' measured by dynamic viscosity measurement has an inflection point in an angular frequency region below 10E+02 rad/s, and the storage modulus G' in the angular frequency below the inflection point is 10E+05 Pa or more and 10E+06 Pa or less. This enables voidless packaging and excellent solder connection properties.

12 Claims, 6 Drawing Sheets

(51) Int. Cl.

| | | |
|---|---|---|
| *C09J 163/00* | (2006.01) | |
| *H01L 21/683* | (2006.01) | |
| *H01L 23/29* | (2006.01) | |
| *H01L 21/56* | (2006.01) | |
| *C09D 133/06* | (2006.01) | |
| *C09J 133/20* | (2006.01) | |
| *C08G 59/42* | (2006.01) | |
| *H01L 23/00* | (2006.01) | |
| *H01L 25/065* | (2006.01) | |
| *H01L 25/00* | (2006.01) | |

(52) U.S. Cl.
CPC ........ *C09D 133/066* (2013.01); *C09J 133/20* (2013.01); *H01L 21/563* (2013.01); *H01L 21/6836* (2013.01); *H01L 23/293* (2013.01); *H01L 24/27* (2013.01); *H01L 24/29* (2013.01); *H01L 24/73* (2013.01); *H01L 24/81* (2013.01); *H01L 24/83* (2013.01); *H01L 24/13* (2013.01); *H01L 24/16* (2013.01); *H01L 24/32* (2013.01); *H01L 24/92* (2013.01); *H01L 24/94* (2013.01); *H01L 25/0657* (2013.01); *H01L 25/50* (2013.01); *H01L 2221/68327* (2013.01); *H01L 2221/68377* (2013.01); *H01L 2224/13025* (2013.01); *H01L 2224/13111* (2013.01); *H01L 2224/13147* (2013.01); *H01L 2224/16146* (2013.01); *H01L 2224/16227* (2013.01); *H01L 2224/16238* (2013.01); *H01L 2224/271* (2013.01); *H01L 2224/27003* (2013.01); *H01L 2224/2919* (2013.01); *H01L 2224/2929* (2013.01); *H01L 2224/29191* (2013.01); *H01L 2224/29291* (2013.01); *H01L 2224/29387* (2013.01); *H01L 2224/32145* (2013.01); *H01L 2224/32225* (2013.01); *H01L 2224/73104* (2013.01); *H01L 2224/81191* (2013.01); *H01L 2224/81193* (2013.01); *H01L 2224/81203* (2013.01); *H01L 2224/81204* (2013.01); *H01L 2224/81815* (2013.01); *H01L 2224/83191* (2013.01); *H01L 2224/83204* (2013.01); *H01L 2224/83862* (2013.01); *H01L 2224/92* (2013.01); *H01L 2224/9211* (2013.01); *H01L 2224/9212* (2013.01); *H01L 2224/94* (2013.01); *H01L 2225/06513* (2013.01); *H01L 2225/06517* (2013.01); *H01L 2924/0635* (2013.01); *H01L 2924/0665* (2013.01); *H01L 2924/186* (2013.01)

(56) References Cited

U.S. PATENT DOCUMENTS

| | | | |
|---|---|---|---|
| 2013/0224913 A1* | 8/2013 | Koyama | C08G 59/42 438/124 |
| 2015/0348858 A1* | 12/2015 | Koyama | C09J 133/04 438/126 |
| 2016/0194517 A1* | 7/2016 | Saito | C09D 133/066 523/400 |

FOREIGN PATENT DOCUMENTS

| | | |
|---|---|---|
| JP | 2013173834 A | 9/2013 |
| JP | 2013175546 A | 9/2013 |

* cited by examiner

UNDERFILL MATERIAL AND METHOD FOR MANUFACTURING SEMICONDUCTOR DEVICE USING THE SAME

TECHNICAL FIELD

This invention relates to an underfill material used for mounting a semiconductor chip and a method for manufacturing a semiconductor device using the same. This application claims priority to Japanese Patent Application No. 2013-187980, filed on Sep. 11, 2013, the entire content of which is incorporated herein by reference.

BACKGROUND ART

In recent years, with an object of shortening processes related to mounting methods of semiconductor chips, the use of pre-applied underfill film (PUF) wherein an underfill film is applied to electrodes of an integrated circuit (IC) has been investigated.

Packaging methods using this pre-applied underfill film are, for example, performed in the following manner (For example, refer to PTL 1).

Step A: An underfill film is applied to a wafer and the wafer is diced to obtain a semiconductor chip(s).

Step B: The semiconductor chip is aligned on the substrate after the application of the underfill film.

Step C: The semiconductor chip and substrate are thermally compressed together, electrical conduction is ensured using metallic bonding of solder bumps, and the semiconductor chip is bonded to the substrate by curing of the underfill film.

Since the pre-applied underfill film is used after lamination on a wafer in advance, the melt viscosity thereof is set to be low in order to achieve an excellent solder connectivity for packaging on a substrate. For example, most of the conventional underfill films have a storage modulus G' of 10E+04 Pa or less and a loss modulus G" of approximately 10E+03 Pa and they do not exhibit non-Bingham fluidity in a molten state, so that removal of air during packaging tends to be insufficient, thus creating voids in a packaging body.

PRIOR ART LITERATURE

Patent Literature

PTL 1 Japanese Unexamined Patent Publication No. 2005-28734

SUMMARY OF THE INVENTION

Problem to be Solved by the Invention

In view of the foregoing, an object of this invention is to provide an underfill film material and a method for manufacturing a semiconductor device using the same which enables voidless mounting and favorable solder bonding properties.

Means for Solving the Problem

In order to solve the aforementioned problem, the present invention provides an underfill material applied to a semiconductor chip having a solder-tipped electrode formed thereon before mounting the semiconductor chip onto an electronic component having a counter electrode facing the solder-tipped electrode, wherein the underfill material contains an epoxy resin, an acid anhydride, an acrylic resin and an organic peroxide, the underfill material exhibits non-Bingham fluidity at a temperature ranging from 60° C. to 100° C., a storage modulus G' measured by dynamic viscosity measurement has an inflection point in an angular frequency region below 10E+02 rad/s, and the storage modulus G' in the angular frequency below the inflection point is 10E+05 Pa or more and 10E+06 Pa or less.

Additionally, as method for manufacturing a semiconductor device of the present invention includes as mounting step of mounting a semiconductor chip onto an electronic component, the semiconductor chip having a solder-tipped electrode formed thereon and an underfill material applied to the surface of the electrode, and the electronic component having a counter electrode facing the electrode, and a thermocompression bonding step of thermally compressing the semiconductor chip and the electronic component, wherein the underfill material contains an epoxy resin, an acid anhydride, an acrylic resin and an organic peroxide, the underfill material exhibits non-Bingham fluidity at a temperature ranging from 60° C. to 100° C., a storage modulus G' measured by dynamic viscosity measurement has an inflection point in an angular frequency region below 10E+02 rad/s, and the storage modulus G' in the angular frequency below the inflection point is 10E+05 Pa or more and 10E+06 Pa or less.

Effects of the Invention

Since the underfill material according to the present invention exhibits non-Bingham fluidity and has a predetermined, storage modulus G' in a molten state, voidless packaging and excellent solder connection properties are achieved.

DESCRIPTION OF THE EMBODIMENTS

Embodiments of the present invention will be described in detail below in the following order.
1. Underfill Material
2. Method for Manufacturing Semiconductor Device
3. Examples

1. UNDERFILL MATERIAL

An underfill material according to this embodiment is applied to a semiconductor chip on which a solder-tipped electrode has been formed, before the semiconductor chip is mounted to an electrical component having a counter solder-tipped electrode formed thereon.

Figure 1:
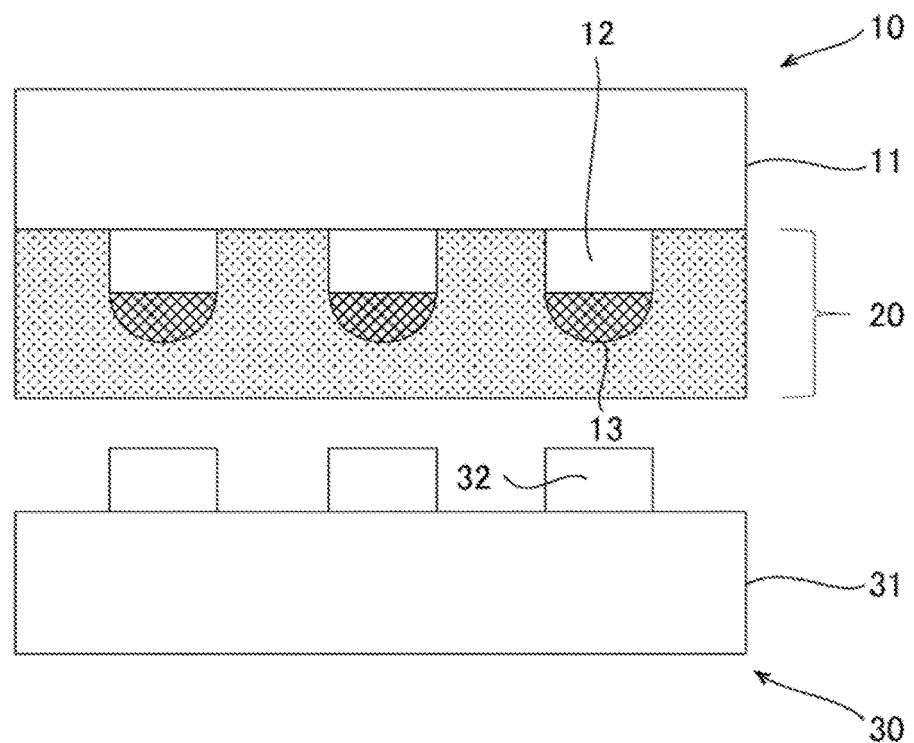
FIG. 1 is a schematic cross-sectional view illustrating a semiconductor chip and a circuit substrate before mounting.
Figure 2:
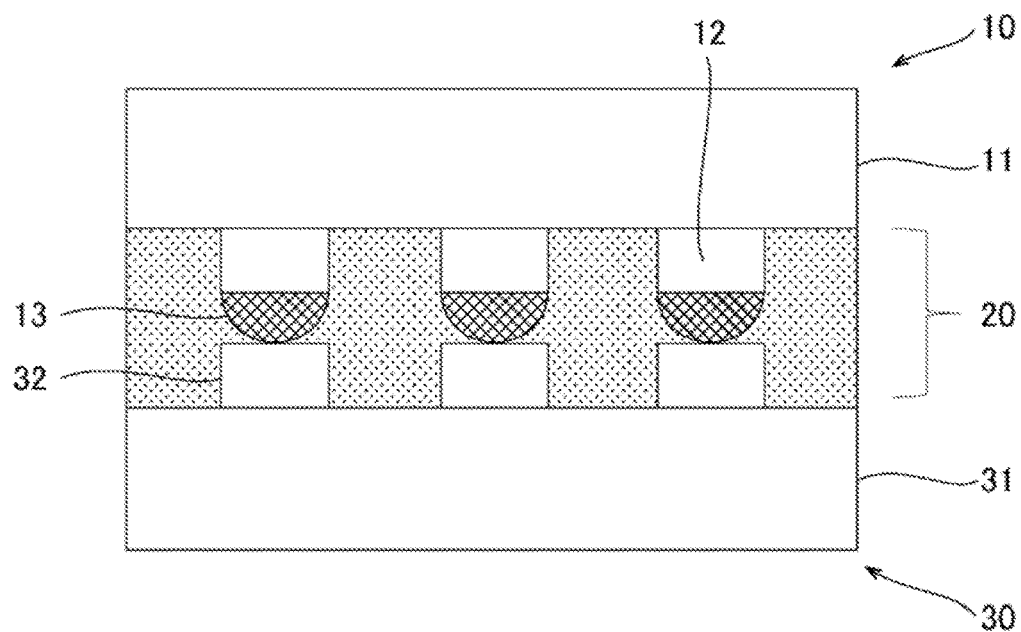
FIG. 2 is a schematic cross-sectional view illustrating the semiconductor chip and the circuit substrate at the time of mounting.
Figure 3:
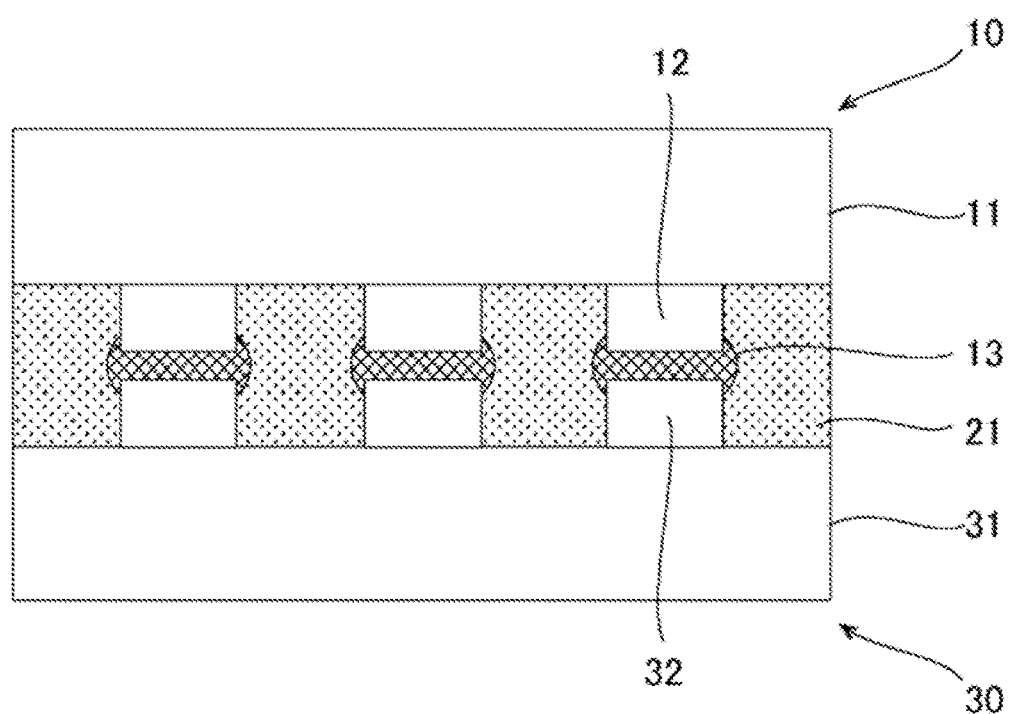
FIG. 3 is a schematic cross-sectional view illustrating the semiconductor chip and the circuit substrate after thermocompression bonding.

FIG. 1 is a cross-sectional schematic view illustrating the semiconductor chip and a circuit substrate before mounting, FIG. 2 is a cross-sectional schematic view of the semiconductor chip and the circuit substrate at the time of mounting, and FIG. 3 is a cross-sectional schematic view of the semiconductor chip and the circuit substrate after thermocompression bonding.

As illustrated in FIGS. 1 to 3, an underfill material 20 according to this embodiment is applied in advance to the electrode side of the semiconductor chip 10 having a solder-tipped electrode formed thereon, and the semiconductor chip 10 is bonded to the circuit substrate 30, on which a counter electrode facing the solder-tipped electrode has been formed, by the adhesive layer 21 formed of the cured underfill material 20.

The semiconductor chip 10 includes an integrated circuit formed on a surface of a semiconductor 11, which is formed from such materials as silicon, and an electrode with bonding-use solder called bump (referred to as solder-tipped electrode). The solder-tipped electrode includes an electrode 12 formed of copper, for example, to which a solder 13 is bonded, total thickness of the solder-tipped electrode being the combined thickness of the electrode 12 and the solder 13.

As a solder, Sn-37Pb eutectic solder (melting point: 183° C.), Sn—Bi solder (melting point: 139° C.), Sn-3.5Ag (melting point: 221° C.), Sn3.0Ag-0.5Cu (melting point: 217° C.), Sn-5.0Sb (melting point: 240° C.), among others, may be used.

The circuit substrate 30 includes a circuit formed on a substrate material 31, which is for example, a rigid substrate or a flexible substrate, among others. Additionally, a counter electrode 32 of a predetermined thickness is formed in the position(s) corresponding to the electrode(s) of the semiconductor chip on the area on which the semiconductor chip 10 is to be mounted.

The underfill material 20 includes a film-forming resin, an epoxy resin, an acid anhydride, an acrylic resin, and an organic peroxide.

The film-forming resin has a weight-average molecular weight of $10*10^4$ or higher corresponding to a high molecular weight resin, and in view of film forming properties, the weight-average molecular weight is preferably in the range of $10*10^4$ to $100*10^4$. As a film-forming resin, an acrylic rubber polymer, a phenoxy resin, an epoxy resin, a modified epoxy resin, and/or a urethane resin, among a variety of other resins, can be used. These film-forming resins may be used individually or in combinations of two or more. In this embodiment, among these film-forming resins, in view of film-strength properties and adhesive properties, an acrylic rubber polymer having a glycidyl group can preferably be used. Preferably, the glass transition temperature Tg of the acrylic rubber polymer ranges from −30° C., to 20° C. This improves the flexibility of the underfill material 20.

Examples of epoxy resin include, glycidylether type epoxy resin such as tetrakis(glycidyloxyphenyl)ethane, tetrakis(glycidyloxymethylphenyl)ethane, tetrakis(glycidyloxyphenyl)methane, tris(glycidyloxyphenyl)ethane and tris(glycidyloxyphenyl)methane, dicyclopentadiene type epoxy resin, glycidylamine type epoxy resin, bisphenol A type epoxy resin, bisphenol F type epoxy resin, bisphenol S type epoxy resin, spiro ring type epoxy resin, naphthalene type epoxy resin, biphenyl type epoxy resin, terpene type epoxy resin, tetrabromobisphenol A type epoxy resin, cresol novolak type epoxy resin, phenol novolak type epoxy resin, α-naphthol novolak type epoxy resin, and brominated phenol novolak type epoxy resin. These epoxy resins may be used individually or in a combination of two or more. Among these, glycidylether type epoxy resin, which has a high adhesion property and heat-resisting property, is preferably used in this embodiment.

Acid anhydride can provide excellent connection reliability because its flux function removes oxide film on a solder surface. Examples of acid anhydride include alicyclic acid anhydrides such as hexahydro phthalic anhydride and methyl tetrahydro phthalic anhydride, aliphatic acid anhydrides such as tetra propenyl succinic anhydride and dodecenyl succinic anhydride, and aromatic acid anhydrides such as phthalic anhydride, trimellitic anhydride and pyromellitic anhydride. These epoxy curing agents may be used individually or in a combination of two or more. Among these, from the viewpoint of solder connectivity, alicyclic acid anhydride is preferably used.

Furthermore, curing accelerator is preferably added. Examples of the curing accelerator include 1,8-diazabicyclo(5,4,0)undecene-7 salt (DBU salt), imidazoles such as 2-methylimidazole, 2-ethylimidazole and 2-ethyl-4-methylimidazole, tertiary amines such as 2-(dimethylaminomethyl)phenol, phosphines such as triphenylphosphine, and metallic compounds such as tin octylate.

As an acrylic resin, monofunctional (meth)acrylate or poly functional (meth)acrylate may be used. Examples of monofunctional (meth)acrylates include methyl(meth)acrylate, ethyl(meth)acrylate, n-propyl(meth)acrylate, i-propyl (meth)acrylate and n-butyl(meth)acrylate. Examples of polyfunctional (meth)acrylate include fluorene-based acrylate, bisphenol F EO-modified di(meth)acrylate, bisphenol A EO-modified di(meth)acrylate, torimetirorlpropan PO-modified (meth)acrylate and multifunctional urethane (meth)acrylate. These acrylic resins may be used individually or in a combination of two or more. Among these, fluorene-based acrylate is preferably used in this embodiment.

Examples of organic peroxide include, peroxy ketal, peroxy ester, hydroperoxide, dialkyl peroxide, diacyl peroxide and peroxydicarbonate. These organic peroxides may be used individually or in as combination of two or more. Among these, peroxy ketal is preferably used in this embodiment.

Furthermore, an inorganic filler is preferably contained as another additive composition. The inorganic filler can regulate the fluidity of resin layers during crimping. As an inorganic filler, silica, talc, titanium oxide, calcium carbonate and magnesium oxide can be used, among others.

Moreover, epoxy-based, amino-based, mercapto-sulfide-based, and ureide-based silane coupling agent may be added as necessary.

Using an epoxy-based agent having a relatively low curing rate together with an acryl-based resin having as a relatively high curing rate enables voidless mounting and excellent solder bonding properties.

Furthermore, at a temperature between 60° C. and 100° C., the underfill material exhibits a non-Bingham fluidity wherein fluidity is observed only after an application of a stress exceeding a certain level (yield stress). This non-Bingham fluidity can be known from a relation in which a dynamic viscosity η' measured by dynamic viscosity measurement is inversely proportional to an angular frequency with a gradient of 10 raised to the power of 1.

Figure 4:
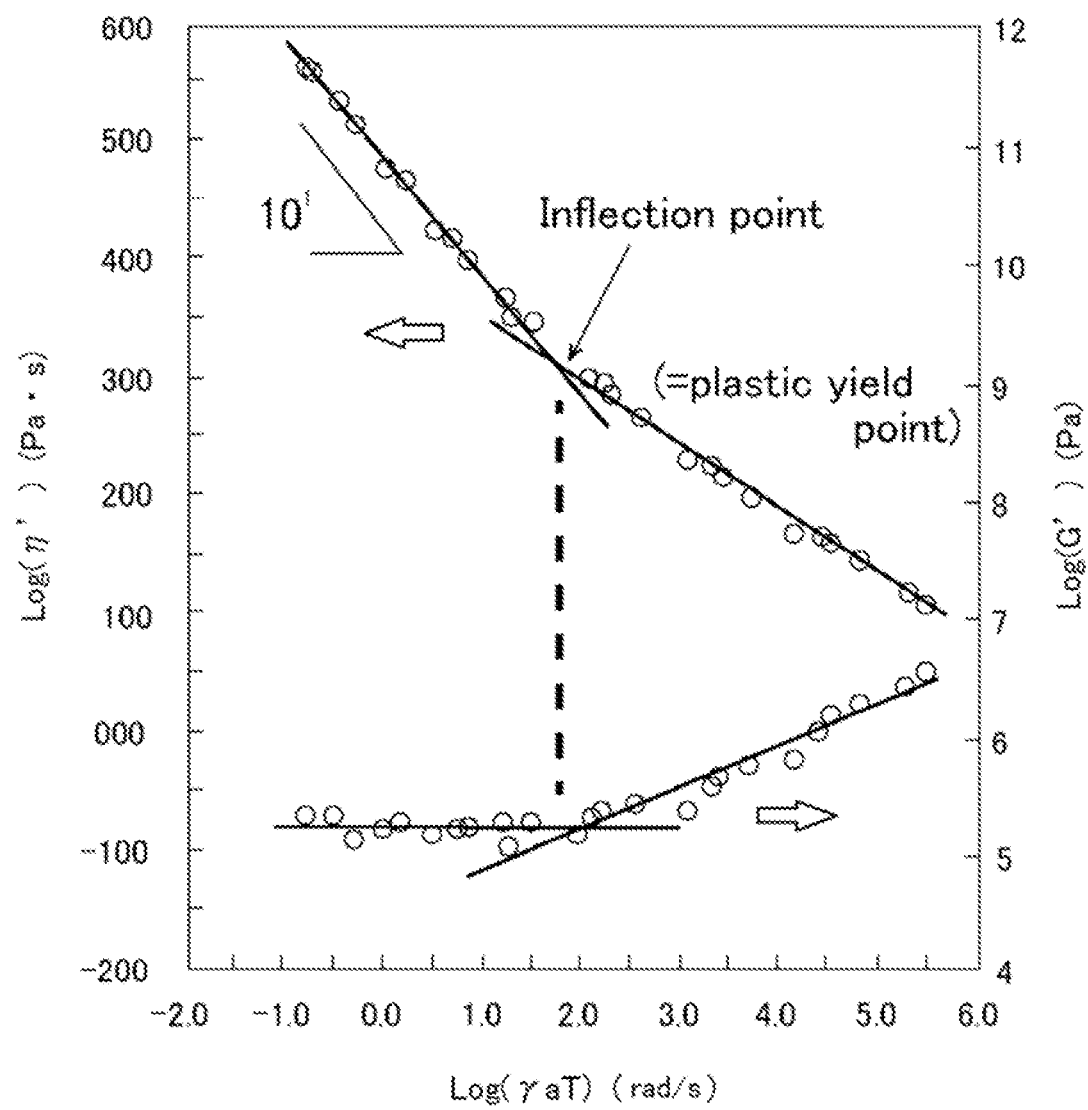
FIG. 4 is an example of a graph showing a master curve of molten state.

FIG. 4 is a graph showing an example of a master curve of a material in a molten state obtained by dynamic viscosity measurement. As shown in the master curve of FIG. 4, in the underfill material, a storage modulus G' has an inflection point in an angular frequency region below 10E+02 rad/s and the storage modulus G' in the angular frequency below the inflection point is constant in a range between 10E+5 Pa and 10E+06 Pa. This enables voidless packaging and excellent solder connection properties.

Additionally, the ratio between the total mass of acrylic resin and organic peroxide and the total mass of epoxy resin and acid anhydride is preferably in the range of 7:3 to 4:6. This can achieve an underfill material that enables voidless packaging and excellent solder connection properties.

Next, a manufacturing method of a pre-applied underfill film wherein the aforementioned underfill material is formed into a film will be explained. An adhesive agent composition containing a film-forming resin, an epoxy resin, an acid anhydride, an acrylic resin and an organic peroxide is dissolved in a solvent. Toluene and ethyl acetate, among others, or a mixture of these may be used as the solvent. The prepared epoxy composition is applied to a detachable substrate material with a bar coater or other applicator.

The detachable substrate material, which has, for example, a layered structure including a release agent such as silicone, coated to a PET (poly ethylene terephthalate, OPP (oriented polypropylene), PMP (poly-4-methylpentene-1), or PTFE (polytetrafluoroethylene) material, maintains the shape of the composition, and prevents the composition from drying.

Next, the epoxy composition, having been applied to the detachable substrate material, is dried by placing it into an oven or a heating and drying device, among others. Thus, a pre-applied underfill film of a predetermined thickness can be obtained.

2. METHOD FOR MANUFACTURING SEMICONDUCTOR DEVICE

Next, a method for manufacturing a semiconductor device using the aforementioned pre-applied underfill film will be explained.

Figure 5:
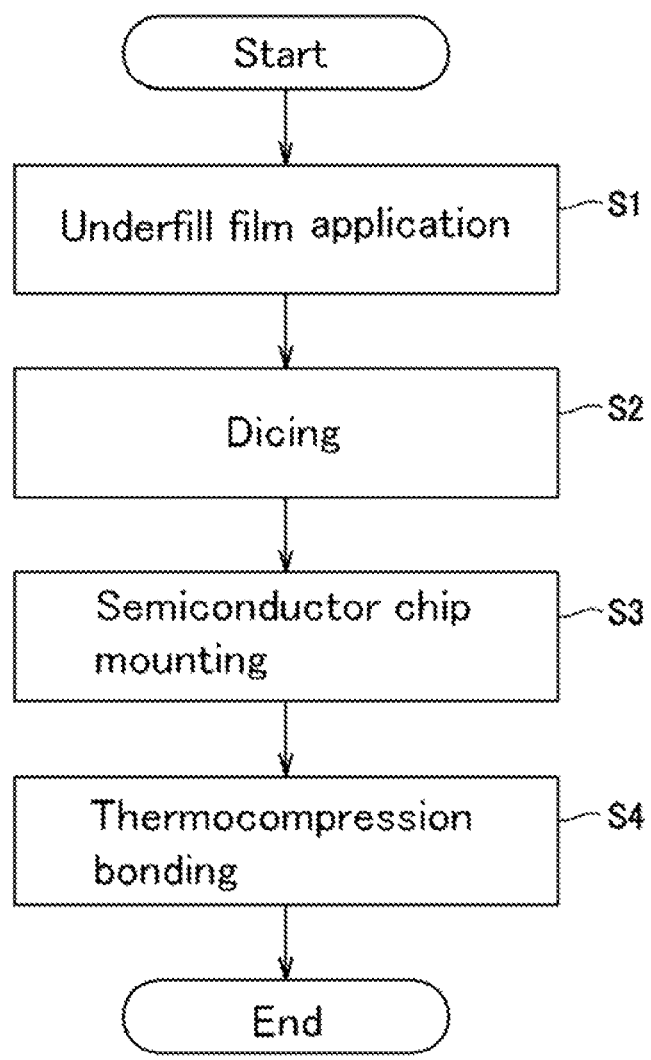
FIG. 5 is a flowchart showing a method for manufacturing a semiconductor device according to an embodiment of this invention.

FIG. 5 is a flowchart illustrating a method for manufacturing the semiconductor device according to this embodiment. As illustrated in FIG. 5, the manufacturing method for manufacturing the semiconductor device according to this embodiment includes an underfill film application step S1, dicing step S2, a semiconductor chip mounting step S3, and a thermocompression bonding step S4.

Figure 6:
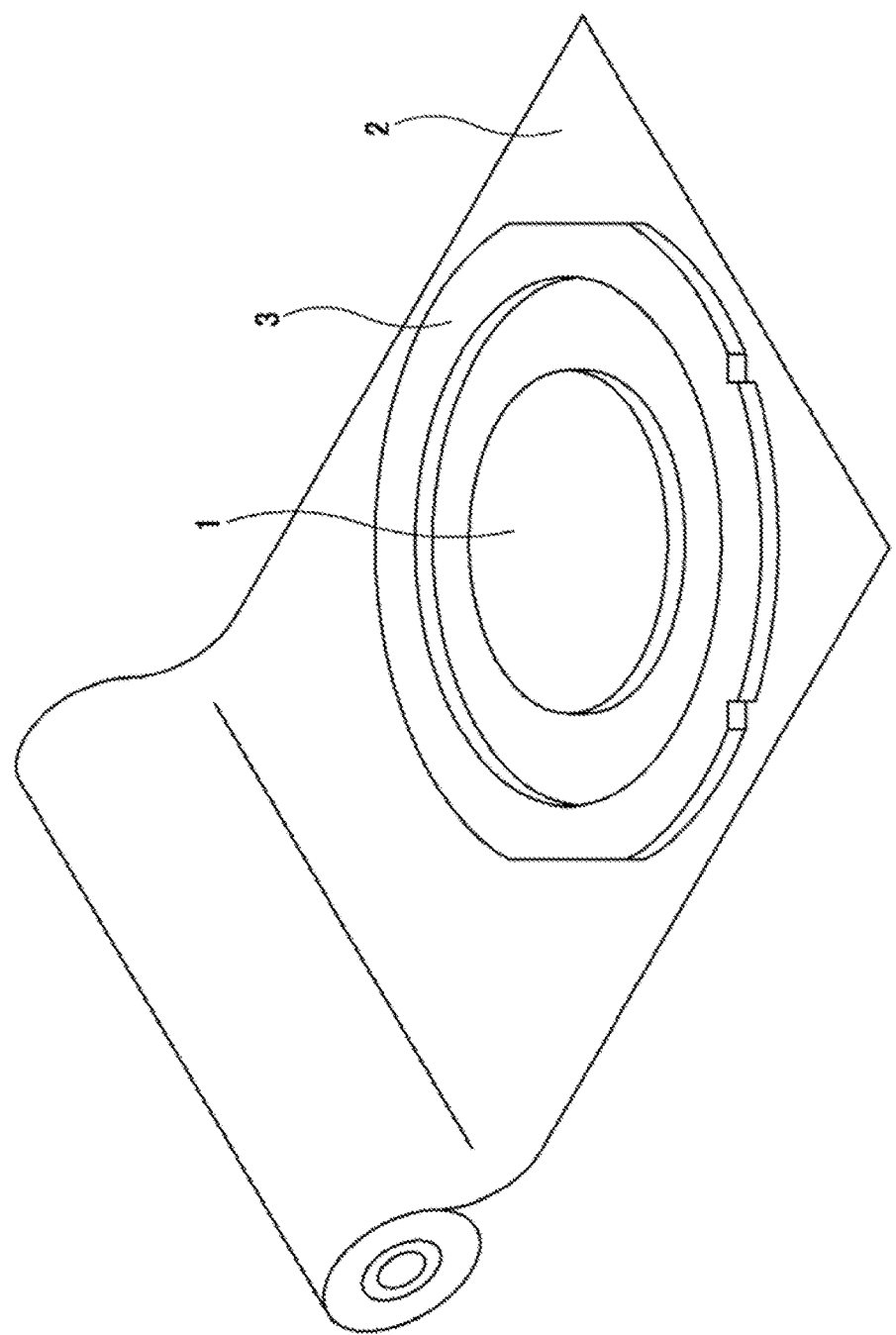
FIG. 6 is a schematic perspective view illustrating a step of applying an underfill film onto a wafer.

FIG. 6 is a schematic perspective view illustrating the step of applying the underfill film onto a wafer. As illustrated in FIG. 6, in the application step S1, a wafer 1 is secured by a jig 3 having a diameter larger than the wafer 1 and having a ring shaped or other enclosing shaped frame, and an underfill film 2 is applied onto the wafer 1. The underfill film 2 protects and secures the position of the wafer 1 during dicing and functions as a dicing tape that retains the wafer 1 during pick-up. It should be noted that a number of ICs (Integrated Circuits) are manufactured on the wafer 1; each of the semiconductor chips 10, demarked by a scribe line on the bonding side of the wafer 1, has a solder-tipped electrode(s) as shown in FIG. 1.

Figure 7:
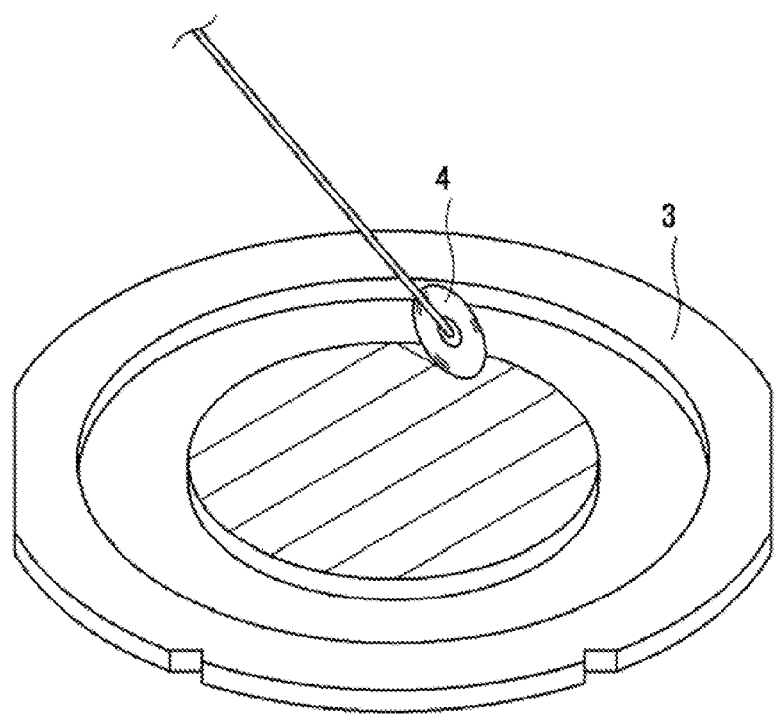
FIG. 7 is a schematic perspective view illustrating a wafer-dicing step.

FIG. 7 is a schematic perspective view illustrating the wafer-dicing step. As shown in FIG. 7, in the dicing step S2, a blade 4 is pressed along scribe lines thereby cutting the wafer 1 and the individual semiconductor chips are separated.

Figure 8:
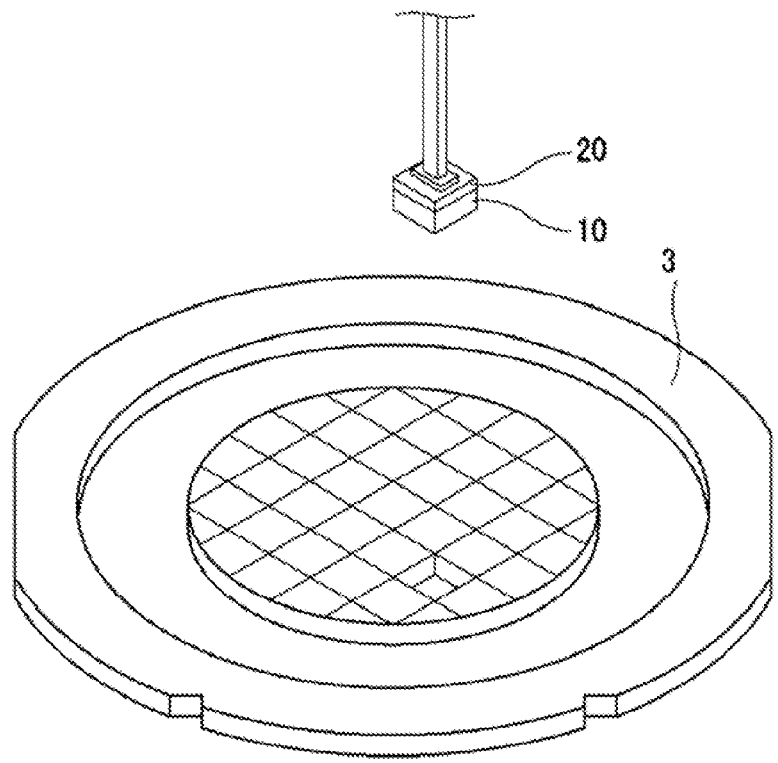
FIG. 8 is a schematic perspective view illustrating a pick-up step of a semiconductor chip.

FIG. 8 is a schematic perspective view illustrating the pick-up step of the semiconductor chip. As shown in FIG. 8, each of the semiconductor chips 10, having an underfill film, is retained by the underfill film during the pick-up.

As illustrated in FIG. 2, in the semiconductor chip mounting step S3, the semiconductor chip 10 is mounted on the circuit substrate 30 via the underfill film. Additionally, the semiconductor chip 10 with underfill film is aligned so that the solder-tipped electrode opposes the counter electrode 32. Thereinafter, thermocompression bonding is performed under predetermined conditions of temperature, pressure, and duration such that the underfill film is made flowable but not completely cured, and mounting is performed.

The temperature condition during mounting is preferably in a range of 30° C. to 155° C. Additionally, the pressure is preferably 50 N or less and more preferably 40 N or less. Additionally, the duration is preferably in a range of 0.1 sec to 10 sec and more preferably in a range of 0.1 sec to 1.0 sec. Thus, the solder-tipped electrode(s) can contact the electrode(s) of the circuit substrate 30 without melting the solder-tipped electrode(s) and the underfill film can be in a state of not being completely cured. Additionally, this fixation at a low temperature can suppress generation of voids and reduce damage to the semiconductor chip 10.

In the thermocompression bonding step S4, under the condition of raising temperature at a predetermined rate from a first temperature to a second temperature, the solder of the solder-tipped electrode is melted to form a metallic bond and the underfill film is completely cured.

Additionally, a height of a bonder head is maintained by the elasticity of resin until the temperature reaches the point at which the mounted underfill film starts to melt; due to resin melting in accordance with temperature rise, the bonder bead rapidly descends to a lowest position. The lowest position is determined by a relation between descent velocity of the bonder head and resin curing speed. After further resin curing, the height of the bonder head is gradually increased due to thermal expansion of the resin and the bonder head. In this manner, by causing the bonder head to descend to the lowest position during the temperature rise from the first temperature to the second temperature, generation of voids that occur because of resin melting can be suppressed.

The first temperature is preferably the same or nearly the same as the minimum melt viscosity attainment temperature of the underfill material and preferably in the range of 50° C. to 150° C. In this manner, curing behavior of the underfill material can be made suitable to the bonding condition and generation of voids can be suppressed. Additionally, the rate of temperature rise is preferably in a range of 50° C./sec to 150° C./sec. Additionally, the second temperature is preferably in a range of 200° C. to 280° C. and more preferably in a range of 220° C. to 260° C., depending on the type of solder. Under these conditions, a metallic bond is formed between the solder-tipped electrode and the substrate electrode, the underfill film is completely cured, and the electrodes of the semiconductor chip 10 are electrically and mechanically connected to the electrodes of the circuit substrate 30.

As explained hereinabove, the manufacturing method of the semiconductor device in this embodiment can achieve voidless packaging and excellent solder bonding properties by applying the underfill material 20 onto a semiconductor chip 10, on which a solder-tipped electrode has been formed, since the underfill material contains an epoxy resin, an acid anhydride, an acrylic resin and an organic peroxide, the underfill material exhibits non-Bingham fluidity at a temperature ranging from 60° C. to 100° C., a storage modulus G' measured by dynamic viscosity measurement has an inflection point in an angular frequency region below 10E+02 rad/s, and the storage modulus G' in the angular frequency below the inflection point is 10E+05 Pa or more and 10E+06 Pa or less.

It should be noted that in the embodiment described above, the underfill film functioned as a dicing tape; however, flip chip packaging may be performed using a mounting method in which another dicing tape is used and the underfill film is used after dicing.

Other Embodiments

In the hereinabove mentioned techniques, by filling pores formed on the semiconductor chip with a metal material, TSV (Through Silicon Via) techniques can be applied wherein more than one layered chip substrates in a sandwiched configuration are electrically connected.

These techniques may be applied to a manufacturing method of a semiconductor device having more than one chip substrate layers comprising a first surface having a solder-tipped electrode formed thereon and, opposite to the first surface, a second surface having a counter electrode formed thereon being opposite to the solder-tipped electrode.

In this case, with the underfill film applied to a first surface side of a first chip substrate, the first surface of the first chip substrate is mounted to a second surface of a second chip substrate. Then the first surface of the first chip substrate and the second surface of the second substrate are thermally compressed at a temperature above the melting point of the solder of the solder-tipped electrode to obtain as semiconductor device with more than one layer of chip substrates can be obtained.

3. EXAMPLES

Examples of the present invention will be explained below. In these examples, pre-applied underfill films were manufactured and the dynamic viscosities thereof were measured. Package bodies were manufactured by connecting an IC Chip having a solder-tipped electrode to an opposing IC substrate having a counter electrode by using the underfill films, and voids and solder bonding properties thereof were evaluated. It should be noted that the present invention is not limited by these examples.

Dynamic viscosity measurement, package body manufacturing, void evaluation, and solder bonding properties evaluation were performed in the following manner.

Dynamic Viscosity Measurement

For each of the underfill films, master curves of dynamic viscosity η' versus angular frequency and of storage modulus G' versus angular frequency were created by using a rheometer (ARES, TA Instruments) at a set temperature of 80° C. to obtain an inflection point, storage modulus G' in an angular frequency region below the inflection point and a gradient of a dynamic viscosity η' in an angular frequency region below the inflection point.

Manufacturing of Package Bodies

The underfill film was applied to the wafer by using a press machine under conditions of 50° C. and 0.5 Mpa and the wafer was diced to obtain an IC chip having a solder-tipped electrode.

The IC chip had a size of 7×7 mm, a thickness of 200 μm, and peripheral bumps (φ30 μm, 85 μm pitch, 280 pin) were formed thereon, each comprising a 20 μm thick Cu electrode with a 16 μm solder (Sn-3.5Ag, melting point: 221° C.) applied to the tip thereof.

Similarly, the IC substrate opposing the IC chip had a size of 7×7 mm, a thickness of 200 μm and peripheral bumps (φ30 μm, 85 μm pitch, 280 pin) formed thereon, each comprising a 20 μm thick Cu electrode.

Then, the IC chip was mounted onto the IC substrate by using a flip chip bonder under a condition of 80° C., 0.5 sec, and 30 N.

Subsequently, thermocompression bonding was conducted by using the flip chip bonder by increasing temperature from 80° C. to 250° C. at the rate of temperature rise of 50° C./sec. Additionally, the bonder head was lowered with a force of 30 N to the lowest position during the time of temperature increase from 80° C. to 250° C. Furthermore, curing was performed under a condition of 150° C. for 2 hours to obtain a package body. It should be noted that the actual temperatures of the samples were measured with a thermocouple during use of the flip chip bonder.

Evaluation of Voids

The package bodies were observed by using an SAT (Scanning Acoustic Tomography). Cases in which voids were not generated in the package body were evaluated as "good" (represented as G, in Table 1) and cases in which voids are generated in the package body were evaluated as "bad" (represented as B, in Table 1). In general, voids might adversely affect long-term reliability.

Evaluation of Solder Bonding Properties

After samples of the package body were cut and the cut sections were polished, state of the solder between the IC chip electrodes and the IC substrate electrodes was observed by using an SEM (Scanning Electron Microscope). Cases in which the sample was observed to have both good solder connections and solder wetting were evaluated as good (G) and cases in which the sample was observed to have either insufficient solder connections or insufficient solder wetting were evaluated as bad (B).

Example 1

A 50/50 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 30 pts. mass, an acid anhydride (RIKACID HNA-100, New Japan Chemical Co., Ltd.) at 20 pts. mass, an imidazole (U-CAT-5002, San-Apro Ltd.) as a curing accelerator at 1 pts. mass, an acrylic resin (OGSOL EA-0200, Osaka Gas Chemicals Co., Ltd.) at 49 pts. mass, an organic peroxide (PERHEXA V, NOF CORPORATION) at 1 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

Results of dynamic viscosity measurement of the underfill film and evaluation results of the package body are shown in Table 1. The inflection point was 10E+1.9 rad/s, the storage modulus G' was 10E+5.3 Pa, the gradient of η' was 10 raised to the power of 1, and this underfill film exhibited non-Bingham fluidity.

In the package body manufactured by using this underfill film, voids were evaluated as good (G) and solder bonding was also evaluated as good (G).

Comparative Example 1

A 50/50 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 55 pts. mass, an acid anhydride (RIKACID HNA-100, New Japan Chemical Co., Ltd.) at 44 pts. mass, an imidazole (U-CAT-5002, San-Apro Ltd.) as a curing accelerator at 2 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

Results of dynamic viscosity measurement of the underfill film and evaluation results of the package body are shown in Table 1. The inflection point was 10E+4.0 rad/s, the storage modulus G' was 10E+4.3 Pa, the gradient of η' was less than 10 raised to the power of 1, and this underfill film did not exhibit non-Bingham fluidity. In the package body manufactured by using this underfill film, voids were evaluated as good (G) and solder bonding was evaluated as bad (B).

Comparative Example 2

A 50/50 acrylic/epoxy resin composition used as the film forming resin was prepared by blending an acrylic rubber polymer (Teisan Resin SG-P3, Nagase chemteX Corporation) as a film forming resin at 40 pts. mass, an acrylic resin (OGSOL EA-0200, Osaka Gas Chemicals Co., Ltd.) at 96 pts. mass, an organic peroxide PERHEXA V, NOF CORPORATION) at 5 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

Results of dynamic viscosity measurement of the underfill film and evaluation results of the package body are shown in Table 1. The inflection point was unclear, the storage modulus G' below 10E+02 rad/s was 10E+6.5 Pa, the gradient of η' below 10E+02 rad/s was more than 10 raised to the power of 1, and this underfill film did not exhibit non-Bingham fluidity. In the package body manufactured by using this underfill film, voids were evaluated as bad (B) and solder bonding was also evaluated as bad (B).

TABLE 1

| Classification | Product Name | Ex. 1 | Com. 1 | Com. 2 |
|---|---|---|---|---|
| Film component | SG-P3 | 40 | 40 | 40 |
| Acrylic resin | EA-0200 | 49 | 0 | 96 |
| Organic peroxide | PERHEXA V | 1 | 0 | 5 |
| Epoxy resin | JER 1031S | 30 | 55 | 0 |
| Acid anhydride | HNA-100 | 20 | 44 | 0 |
| Curing accelerator | U-CAT-5002 | 1 | 2 | 0 |
| Filler | AEROSIL R202 | 15 | 15 | 15 |
| Total | | 156 | 156 | 156 |
| Acryl ratio | | 50 | 0 | 100 |
| Epoxy ratio | | 50 | 100 | 0 |
| Inflection point [rad/s] | | 10E + 1.9 | 10E + 4.0 | not exist |
| Storage modulus G' [Pa] | | 10E + 5.3 | 10E + 4.3 | 10E + 6.5 |
| Gradient of η' | | 10^1 | less than 10^1 | more than 10^1 |
| non-Bingham fluidity | | Yes | No | No |
| Void evaluation | | G | G | B |
| Solder bonding state evaluation | | G | B | B |

As shown in the example, the underfill film exhibiting non-Bingham fluidity in a molten state was able to achieve voidless packaging and excellent solder connection properties.

REFERENCE SIGNS LIST

1 wafer, 2 underfill film, 3 jig, 4 blade, 10 semiconductor chip, 11 semiconductor, 12 electrode, 13 solder, 20 underfill material, 21 first adhesive layer, 22 second adhesive layer, 30 circuit substrate, 31 substrate material, 32 counter electrode

The invention claimed is:

1. An underfill material applied to a semiconductor chip having a solder-tipped electrode formed thereon before mounting the semiconductor chip onto an electronic component having a counter electrode facing the solder-tipped electrode, wherein
    the underfill material comprises an epoxy resin, a curing agent, an acrylic resin, and an organic peroxide,
    a ratio of the total mass of acrylic resin and organic peroxide to the total mass of epoxy resin and curing agent is in a range of 7:3 to 4:6,
    the underfill material exhibits non-Bingham fluidity at a temperature ranging from 60° C. to 100° C., and
    a storage modulus G' measured by dynamic viscosity measurement has an inflection point in an angular frequency region below 10E+02 rad/s and the storage modulus G' in the angular frequency below the inflection point is 10E+05 Pa or more and 10E+06 Pa or less.

2. The underfill material according to claim 1, wherein a dynamic viscosity η' measured by dynamic viscosity measurement is inversely proportional to the angular frequency below the inflection point with a gradient of 10 raised to the power of 1.

3. The underfill material according to claim 2, wherein the storage modulus G' in the angular frequency below the inflection point is constant.

4. The underfill material according to claim 1, wherein the storage modulus G' in the angular frequency below the inflection point is constant.

5. The underfill material according to claim 1, wherein the epoxy resin is a glycidylether epoxy resin, and the curing agent is an alicyclic acid anhydride.

6. The underfill material according to claim 2, wherein the acrylic resin is a fluorene acrylate, and the organic peroxide is a peroxy ketal.

7. The underfill material according to claim 4, wherein the epoxy resin is a glycidylether epoxy resin, and the curing agent is an alicyclic acid anhydride.

8. The underfill material according to claim 1, wherein the acrylic resin is a fluorene acrylate, and the organic peroxide is a peroxy ketal.

9. The underfill material according to claim 2, wherein the epoxy resin is a glycidylether epoxy resin, and the curing agent is an alicyclic acid anhydride.

10. The underfill material according to claim 4, wherein the acrylic resin is a fluorene acrylate, and the organic peroxide is a peroxy ketal.

11. The underfill material according to claim 5, wherein the acrylic resin is a fluorene acrylate, and the organic peroxide is a peroxy ketal.

12. A method for manufacturing a semiconductor device comprising:
   a mounting step of mounting a semiconductor chip onto an electronic component, the semiconductor chip having a solder-tipped electrode formed thereon and an underfill material applied to the surface of the electrode, and the electronic component having a counter electrode facing the electrode, and
   a thermocompression bonding step of thermally compressing the semiconductor chip and the electronic component, wherein
   the underfill material comprises an epoxy resin, a curing agent, an acrylic resin, and an organic peroxide, a ratio of the total mass of acrylic resin and organic peroxide to the total mass of epoxy resin and curing agent is in a range of 7:3 to 4:6, the underfill material exhibits non-Bingham fluidity at a temperature ranging from 60° C. to 100° C., a storage modulus G' measured by dynamic viscosity measurement has an inflection point in an angular frequency region below 10E+02 rad/s, and the storage modulus G' in the angular frequency below the inflection point is 10E+05 Pa or more and 10E+06 Pa or less.

\* \* \* \* \*